United States Patent
Ahsan et al.

(10) Patent No.: US 7,719,005 B2
(45) Date of Patent: May 18, 2010

(54) STRUCTURE AND METHOD FOR MONITORING AND CHARACTERIZING PATTERN DENSITY DEPENDENCE ON THERMAL ABSORPTION IN A SEMICONDUCTOR MANUFACTURING PROCESS

(75) Inventors: Ishtiaq Ahsan, Wappingers Falls, NY (US); Oleg Gluschenkov, Poughkeepsie, NY (US)

(73) Assignee: International Buriness Machines Corporation, Armonk, NY (US)

( * ) Notice: Subject to any disclaimer, the term of this patent is extended or adjusted under 35 U.S.C. 154(b) by 347 days.

(21) Appl. No.: 11/672,059

(22) Filed: Feb. 7, 2007

(65) Prior Publication Data

US 2008/0185583 A1 Aug. 7, 2008

(51) Int. Cl.
*H01L 21/66* (2006.01)
*H01L 23/58* (2006.01)

(52) U.S. Cl. .................. 257/48; 257/620; 257/622; 257/E23.004; 257/E21.53; 438/11; 438/17; 438/18

(58) Field of Classification Search .............. 257/48; 438/11
See application file for complete search history.

(56) References Cited

U.S. PATENT DOCUMENTS

| | | | |
|---|---|---|---|
| 6,383,827 B1 * | 5/2002 | Lukanc et al. ............. | 438/18 |
| 6,812,550 B1 * | 11/2004 | En et al. .................... | 257/629 |
| 2003/0094608 A1 * | 5/2003 | Abadeer et al. ............ | 257/48 |
| 2005/0035433 A1 * | 2/2005 | Park et al. .................. | 257/620 |
| 2007/0264729 A1 * | 11/2007 | Anderson et al. .......... | 438/14 |

FOREIGN PATENT DOCUMENTS

WO   WO 2006098023 A1 * 9/2006

OTHER PUBLICATIONS

M. Okazaki; M. Hatano; K. Yoshida; S. Shibasaki; H. Kaneko; T. Yoda; N. Hayasaka, "Sea of Kelvin" Multiple-pattern arrangement interconnect characterization for low-k/Cu dual damascene and its findings, Internconnect Technology Conference 2004, Proceedings of the IEEE 2004 International. Jun. 7-9, 2004 on pp. 211-213.*

* cited by examiner

*Primary Examiner*—N Drew Richards
*Assistant Examiner*—John P Dulka
(74) *Attorney, Agent, or Firm*—Ian D. MacKinnon (57) ABSTRACT

According to the present invention, there is disclosed a thermal detection device and method of using the device for characterizing and monitoring the dependence of pattern density on thermal absorption of a semiconductor. One or more of the devices can be disposed on a die of a test wafer. The thermal detection device comprises a silicon substrate having a test structure located substantially in the center of the silicon substrate. Frame shaped structures of polysilicon, silicon and oxide, in various configurations, form a collocated arrangement on the silicon substrate. The test wafer is subjected to a rapid thermal process and the resistance of the at least one testing structure is measured and the measured resistance of the at least one test structure is tabulated to a thermal absorption value of the at least one die.

12 Claims, 7 Drawing Sheets

FIG. 10 ved by oxide, typically corresponding to the isolation area between transistors on the silicon substrate. Also, there are portions where the crystalline silicon is the exposed surface, and there are portions where the poly-crystalline silicon constitute the exposed surface. Hence the pattern density (that is, the ratio of silicon covered with oxide or poly-crystalline silicon to exposed silicon over a given area) affects the thermal absorption, which is in turn affected by the temperature that the semiconductor reaches during the RTP. This temperature depends on the application, but can be beyond 1,000 degrees Centigrade.

STRUCTURE AND METHOD FOR MONITORING AND CHARACTERIZING PATTERN DENSITY DEPENDENCE ON THERMAL ABSORPTION IN A SEMICONDUCTOR MANUFACTURING PROCESS

FIELD OF THE INVENTION

The present invention relates generally to the manufacture of semiconductor devices. More particularly, the invention provides a system and method for monitoring a rapid thermal annealing process for the manufacture of integrated circuits.

BACKGROUND

Semiconductor devices or "ICs" (integrated circuits) have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of semiconductor wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed.

An example of such a limit is the ability to accurately monitor temperatures in an efficient manner for rapid thermal anneal processes (RTP). RTP is important for any type of semiconductor wafer processing which requires precise temperature control and fast ramp up rate of the temperature. Consequently, RTP must be carried out in a specially-designed rapid thermal annealing (RTA) chamber, rather than in a conventional semiconductor wafer furnace having walls and other components characterized by high thermal conductivity that would hinder rapid thermal cycling. RTA chambers that use radiant heating are designed to thermally isolate a semiconductor wafer such that radiant, rather than conductive, heat is used in semiconductor wafer processing. As a result, all portions of the wafer are more uniformly heated, thereby eliminating or at least reducing thermal gradients which would otherwise cause wafer slip and warping. However, in order for the RTP to provide a high manufacturing yield, the temperature of the wafer must be accurately monitored, or the semiconductor device will not have the expected characteristics. Various design challenges make accurate temperature measurement difficult. In particular, the temperature is a result of the thermal absorption properties of the semiconductor device. However, the semiconductor device does not heat uniformly. Different exposed material on the semiconductor wafer has different reflectivity and hence absorbs different amounts of radiative heat. For example, in a typical semiconductor device, there is a silicon substrate with portions cov- What is needed is a relatively inexpensive structure, method and system for monitoring and characterizing the dependence thermal absorption on these various pattern densities of a various rapid thermal process.

SUMMARY OF THE INVENTION

According to the present invention, a thermal detection device for characterizing and monitoring the dependence of pattern density on thermal absorption of a semiconductor comprises a silicon substrate having a first oxide layer disposed on the upper surface thereof and a test structure disposed on the first oxide layer wherein the test structure is located substantially in the center of the silicon substrate. The first oxide layer is disposed in a first trench formed in the silicon substrate. The test structure is preferably a Kelvin test structure.

Further according to the present invention, the thermal detection device includes at least one polysilicon frame shaped structure formed of a gate oxide layer disposed on the silicon substrate and surrounding the first oxide layer and a polysilicon layer disposed on the gate oxide layer.

Still further according to the present invention, the thermal detection device includes two or more polysilicon frame shaped structures, each formed of a gate oxide layer disposed on the silicon substrate and a polysilicon layer disposed on the gate oxide layer. The two or more polysilicon frame shaped structures form a collocated arrangement with at least one frame shaped oxide layer, one of which being disposed in a frame shaped trench between each of the two or more polysilicon frame shaped structures.

Yet further according to the present invention, the thermal detection device includes two or more frame shaped oxide structures, each formed of a second oxide layer disposed in a frame shaped trench on the silicon substrate. The two or more oxide frame shaped structures form a collocated arrangement. Also, two or more silicon frame shaped structures form a collocated arrangement with one of the silicon frame shaped structures surrounding the first oxide layer. In addition, one or more oxide frame shaped structures are each disposed between each of the two or more silicon frame shaped structures.

According to the present invention, the thermal detection device further includes at least one silicon frame shaped structure surrounding the first oxide layer. Still further the thermal detection device includes two or more silicon frame shaped structures forming a collocated arrangement with a frame shaped oxide layer disposed in a frame shaped trench between each of the two or more silicon frame shaped structures.

Still further according to the present invention, the at least one polysilicon frame shaped structure, the at least one frame shaped oxide layer and the at least area of silicon substrate are of a shape selected from the group consisting of rectangular, circular, square and oval.

According to the present invention, a semiconductor wafer comprises a plurality of dies, at least one die having one or more thermal absorption detection structures thereon for characterizing and monitoring the dependence of pattern density of the at least one die on the thermal absorption of the at least one die. Each of the one or more thermal absorption detection structures are a silicon substrate having a first oxide layer disposed on the upper surface of the silicon substrate and a test structure disposed on the first oxide layer and located substantially in the center of the silicon substrate.

Further according to the present invention, the at least one die comprises at least one thermal absorption detection structure with a plurality of polysilicon frame structures.

Still further according to the present invention, the at least one die comprises at least one thermal absorption detection structure with a plurality of silicon frame structures.

According to the present invention, a method for monitoring and characterizing pattern density dependence on thermal absorption in a semiconductor manufacturing process, comprises a number of steps: First, a test wafer is created having at least one die incorporating at least one thermal absorption detection structure. The at least one thermal absorption detection structure includes a silicon substrate having a first oxide layer disposed on the upper surface thereof and a test structure is disposed on the first oxide layer wherein the test structure is located substantially in the center of the silicon substrate. Then the wafer is subjected to a rapid thermal process. The resistance of the at least one testing structure is measured and the measured resistance of the at least one test structure is tabulated to a thermal absorption value of the at least one die.

Further according to the present invention, the method comprises the step of determining the thermal absorption of the at least one die based on measured resistance of the at least one thermal absorption detection structure on the test wafer and the rapid thermal process is adjusted to substantially match the thermal absorption of the at least one die.

Still further according to the present invention, the method further comprises the step of creating a wafer with at least one die having at least one thermal absorption detection structure with one or more silicon frame structures.

Also according to the present invention, the method comprises the step of creating a wafer with at least one die having at least one thermal absorption detection structure with one or more polysilicon frame structures.

Yet further according to the present invention, the method further comprises the step of creating a wafer with at least one die having at least one thermal absorption detection structure with one or more silicon frame structures and at least one thermal absorption detection structure with one or more polysilicon frame structures.

Further according to the present invention, the method further comprises the step of creating a wafer with at least one die having at least one thermal absorption detection structure with one or more polysilicon frame structures.

Still further according to the present invention, the method further comprises the step of creating a wafer with at least one die having at least one thermal absorption detection structure with one or more oxide frame structures.

DETAILED DESCRIPTION

The present invention provides a structure and method for monitoring and characterizing pattern density dependence on thermal absorption within a semiconductor wafer. The present invention accomplishes this by the use of a novel temperature absorption detection (TAD) structure. A plurality of TAD structures are placed at various locations within a die. The TAD structure contains a testing structure within it. After undergoing RTP, the sheet resistance is measured on the TAD structure via the testing structure. Because the measured sheet resistance varies inversely as a function of the thermal absorption, it is possible to correlate the measured sheet resistance to a thermal absorption value (the amount of thermal absorption that took place during the RTP). By placing TAD structures at multiple locations on a wafer, it is possible to characterize the cross wafer temperature variation from the pattern density dependent temperature absorption. A major advantage of the present invention is the relatively inexpensive and simple design. The disclosed embodiments require only three mask layers, all of which, are block level, inexpensive masks.

Furthermore, various details of a real chip can be omitted when building the TAD structure. For example, it is not important to have all the different implants (well implant, source-drain implant, other threshold voltage tuning implants) that a typical integrated circuit requires.

Another advantage of the present invention is that no back-end build (contacts to silicon, various layers of metal levels, etc. . . . ) is necessary for this test-structure.

Another advantage of the present invention is that, because of its simplicity in design, it is much quicker to build this test-structure than a real product chip.

Figure 1A:
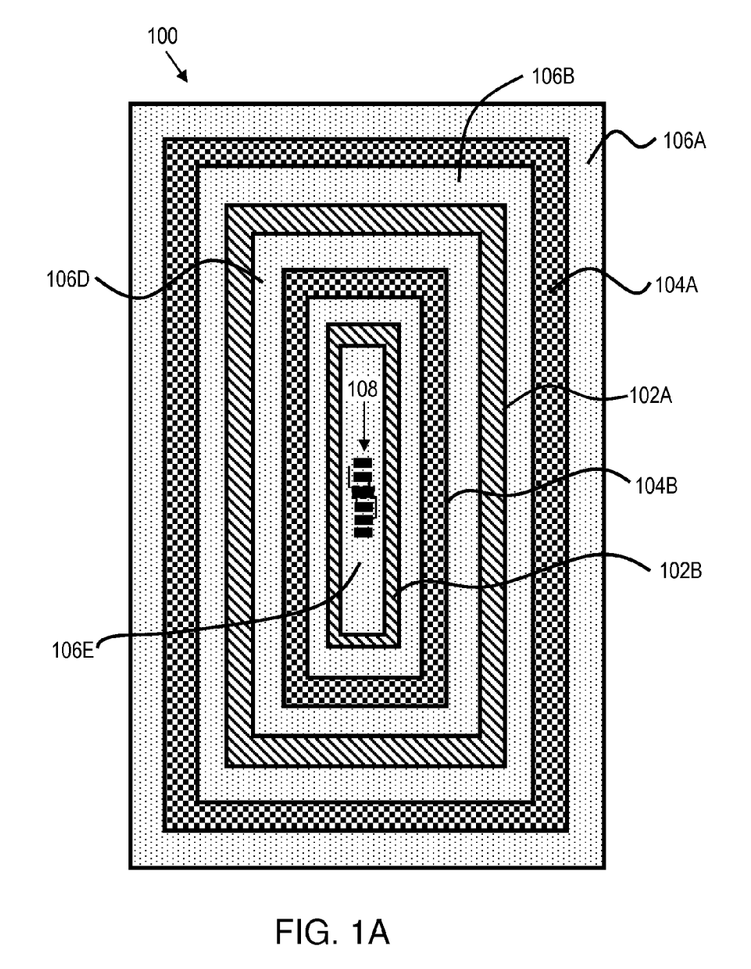
FIG. 1A shows a thermal absorption detection structure of the present invention.
Figure 1B:
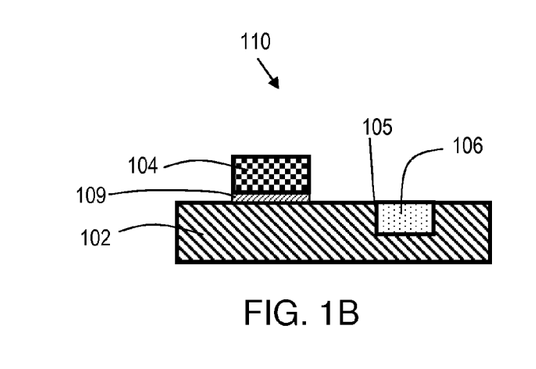
FIG. 1B shows a general cross-section view of the layers that comprise a thermal absorption detection structure of the present invention.

Referring now to the FIG.s, FIG. 1A shows an exemplary thermal absorption detection (TAD) structure 100. While not shown in FIG. 1A, the TAD structure 100 is typically formed on a die (See FIG. 9) using techniques known in the art, such as photolithography and/or etch techniques. TAD structure 100 is comprised of a multilayer substrate 110. These layers are illustrated in the cross section view of FIG. 1B. In general, the multilayer substrate 110 is comprised of a base layer 102, preferably comprised of single crystalline silicon, a polysilicon layer 104, and an oxide layer 106. The multilayer substrate 110 is constructed using techniques known in the art, such as photolithography and/or etch techniques. First, a plurality of narrow cavities or trenches 105 are etched into base layer 102. Then oxide layers 106 are deposited within the trenches 105 using industry standard techniques such as chemical vapor deposition (CVD). Then layers 109 of gate oxide are disposed on top of base layer 102 in a plurality of strips (not shown). Then, one or more layers 104 of polysilicon are deposited on top of the layers 109 of gate oxide.

As is shown in FIG. 1A, the TAD structure 100 includes the rectangular shaped structures 102A and 102B comprised of single crystalline silicon base layer 102, polysilicon layers 104A and 104B, and oxide layers 106A, 106B, 106C, 106D, 106E arranged to form a series of shaped structures having the same shape but different sizes, referred to as "frame structures" collocated within each other, thereby forming a so called "collocated arrangement." Typically, the frame structures are rectangular but other shapes are also used as discussed hereinafter.

The two rectangular shaped structures, referred to as "frame structures" 102A and 102B are formed by depositing layers 109 of gate oxide and the polysilicon layers 104 using standard lithographic mask techniques. Note that while most of the discussion of this invention refers to an embodiment of a TAD structure having a rectangular shape, other shapes are possible, and within the scope of the present invention. TAD structures of other shapes may include, but are not limited to, a square TAD structure (FIG. 10), a circular TAD structure (FIG. 11), and an oval TAD structure (FIG. 12).

Figure 1C:
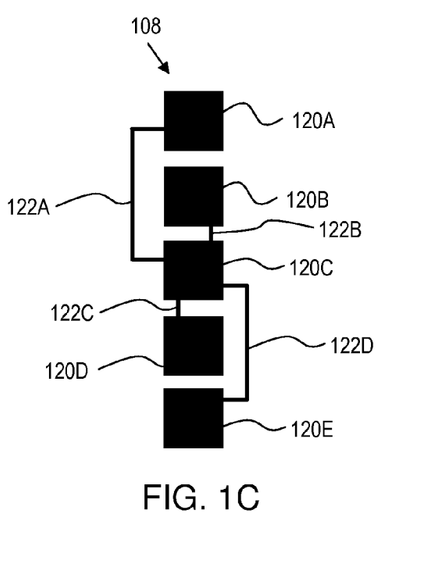
FIG. 1C shows details of an embodiment of the thermal sensor of the thermal absorption detection structure of the present invention.

In the approximate center of the innermost frame structure 102B is testing structure 108. Test structure 108 is formed on top of a rectangular region of oxide 106E via methods that are well known in the art. A preferred embodiment of testing structure 108 is a Kelvin test structure, which is illustrated in more detail in FIG. 1C. Other test structures may be possible, within the scope of the present invention. The purpose of the testing structure 108 is to provide a convenient way for performing a sheet resistance measurement. The Kelvin test structure is a well known measuring technique. For example, the use of a Kelvin test structure is described in U.S. Patent Application 20050027476 of Lim, and U.S. Pat. No. 6,403,389 of Chang, et al., both of which are incorporated herein by reference. The testing structure 108 has a plurality of contacts 120A-120E that are interconnected via polysilicon lines 122A-122D. The arrangement as shown in FIG. 1C forms a Kelvin test structure which can be probed via existing industry equipment to determine the sheet resistance seen at the test structure. The sheet resistance changes depending on the degree of thermal absorption. The resistance can be easily measured using a standard in-line tester. Since the pattern density of the TAD structure 100 is known, a known relationship between the pattern density and thermal absorption can be established.

In one embodiment, testing structure 108 is comprised of polysilicon, similar to the polysilicon of polysilicon layer 104. In an alternative embodiment, testing structure 108 may be formed of mono-crystalline silicon. In this disclosure, mono-crystalline silicon is referred to as "silicon," and silicon having a polycrystalline structure is referred to as "polysilicon."

It should clearly be understood that FIG. 1A illustrates an extremely small (microscopic) portion of an integrated circuit (IC) device, let alone a semiconductor wafer comprising a large plurality of such devices. For example, what is shown may have a width of only a few microns (μm) of a semiconductor wafer having a diameter of several inches. Also, in "real life" things are not so neat and clean, rectilinear and uniform as shown. However, for one of ordinary skill in the art to which the invention most nearly pertains, this and other FIG.s presented in this patent application will be very useful, when taken in context of the associated descriptive text, for understanding the invention.

The TAD structure 100 shown in FIG. 1A (as well as in the other FIG.s) is generally fabricated utilizing conventional processing steps well known to those skilled in the art. Except for the processing steps of the present invention, such processing steps and techniques are well known and are not critical for understanding the present invention. Therefore a detailed discussion of these well known steps is not given herein. It will be understood that various steps and materials have been omitted, for illustrative clarity, such as seed layers, adhesion layers, cleaning steps and the like.

Figure 2:
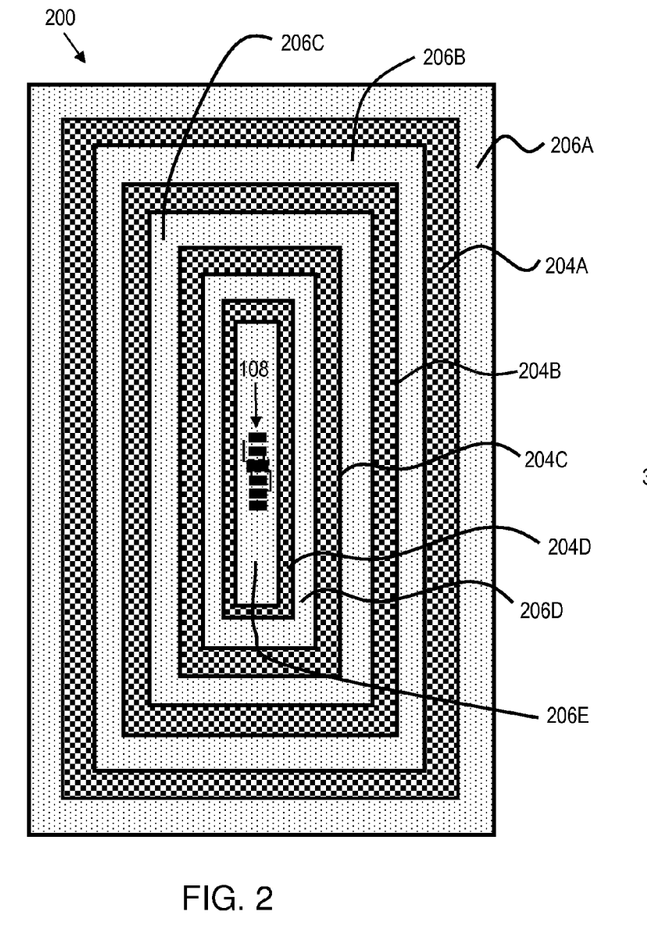
FIGS. 2-8 show other thermal absorption detection structures of the present invention having a variety of pattern densities.

FIG. 2 shows another TAD structure 200 of the present invention. It is similar to TAD structure 100 of FIG. 1A, including a pattern comprised of frame structures 204A-204D (compare 104A, 104B) formed of exposed polysilicon layers and a pattern of frame structures 206A, 206B, 206C, 206D,206E formed of oxide layers (compare oxide layers 106A, 106B, 106C, 106D, 106E). Note that TAD structure 200 does not have any layers of exposed silicon.

Figure 3:
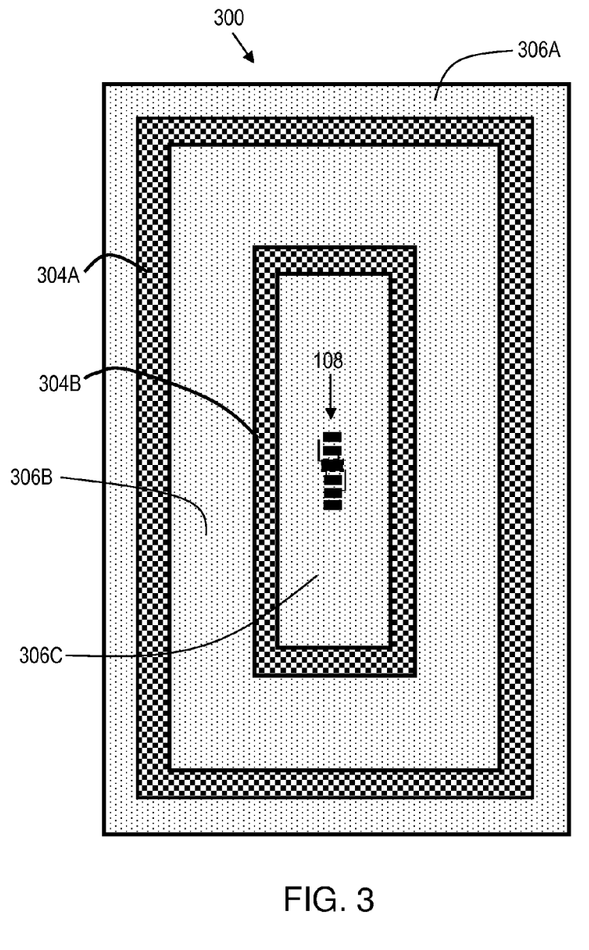

TAD structure 300 of FIG. 3 is similar to TAD structure 200 of FIG. 2, including a pattern comprised of frame structures 304A, 304B (compare 104A,104B) formed of exposed polysilicon layers and a pattern of frame structures 306A, 306B, 306C formed of oxide layer (compare oxide layers 206A, 206B, 206C,206D,206E). TAD structure 300 also does not have any exposed silicon. With TAD structure 300, since it has a pattern comprised of fewer frame structures in a given area as compared to TAD structures 100 and 200, TAD structure 300 has a lower pattern density than that of FIG. 2 and therefore the resistance measured via test structure 108 will be different than on the test structure shown in FIG. 2. The relationship of the resistance amongst various test structures is used to correlate the resistance to the pattern density. Since the resistance is a function of the thermal absorption (that occurred when the test structure underwent RTP), it is possible to correlate thermal absorption to pattern density. This is a useful relationship to characterize in the manufacture of semiconductor devices.

Figure 4:
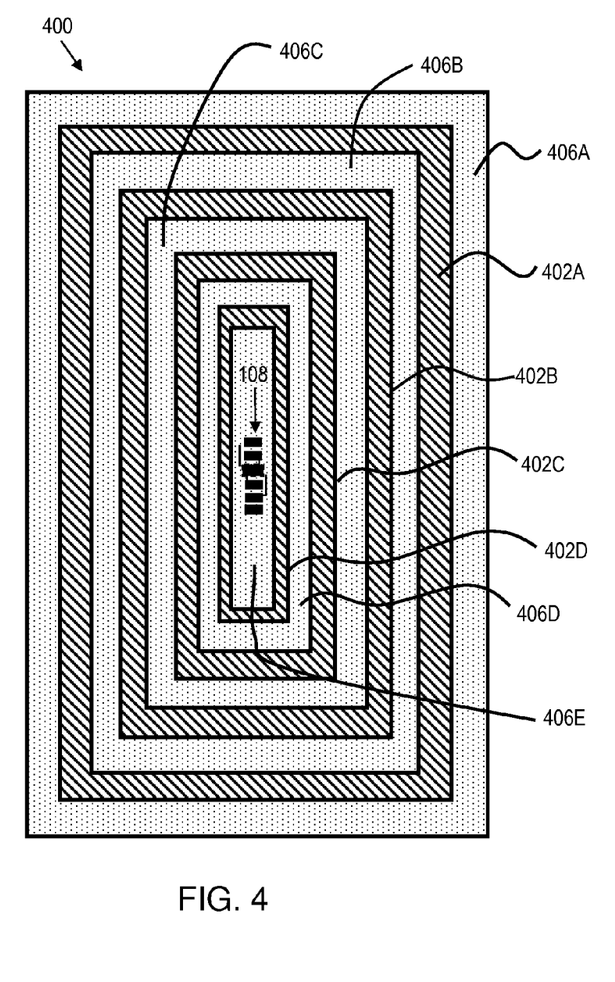

FIG. 4 shows another TAD structure 400 of the present invention. It is similar to TAD structure 100 of FIG. 1A, except that it has a pattern comprised of frame structures 402A-402E formed of exposed silicon (compare 102A, 102B) and a pattern of frame structures 406A, 406B, 406C, 406D (compare oxide layers 206A, 206B, 206C, 206D) formed of an oxide layer. TAD structure 400 does not have any frame structures of polysilicon.

Figure 5:
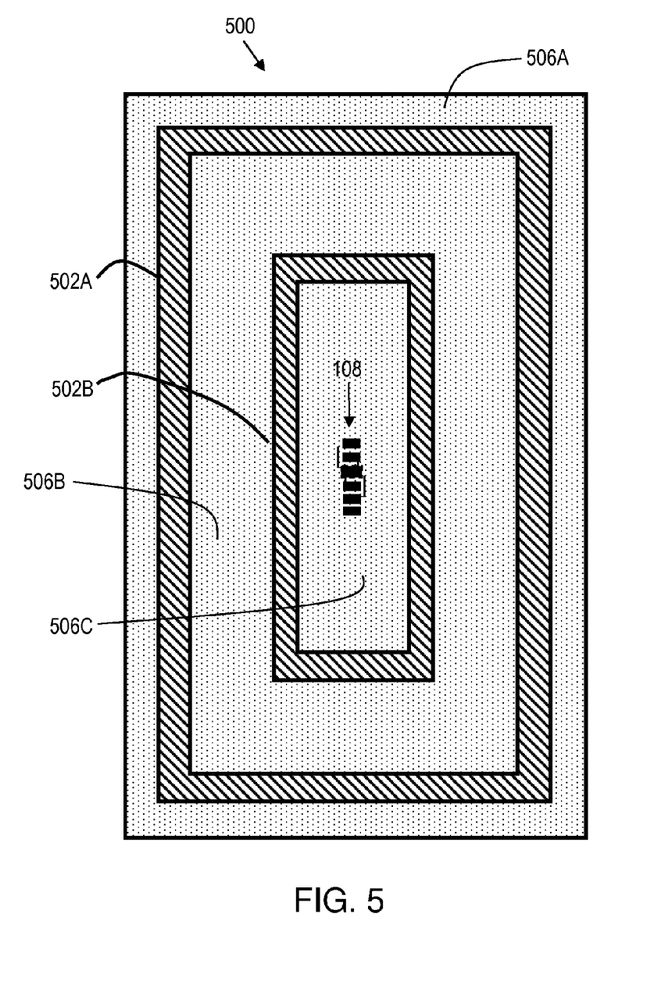

TAD structure 500 of FIG. 5 is similar to TAD structure 400 of FIG. 4. TAD structure 500 also does not have any polysilicon. However, TAD structure 500 has a pattern comprised of frame structures 506A, 506B and 506C of oxide (compare 406A-406E) and frame structures 502A and 502B (compare 402A-402E) of exposed silicon. Because there are fewer frame structures in a given area, TAD structure 500 has a lower silicon pattern density than that of FIG. 4 and therefore the resistance measured via test structure 108 will be different than on the test structure shown in FIG. 4.

Figure 6:
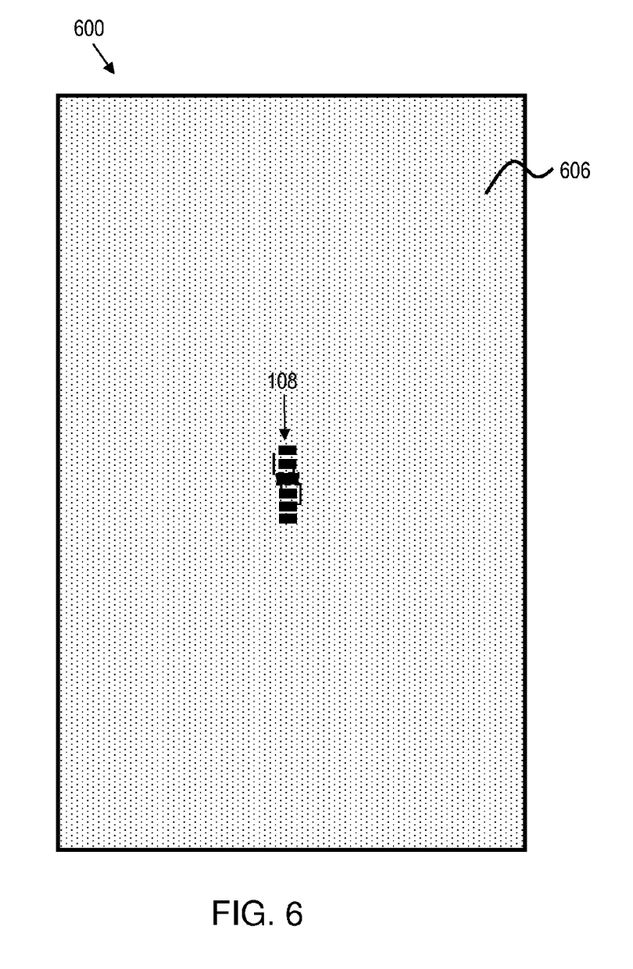
Figure 7:
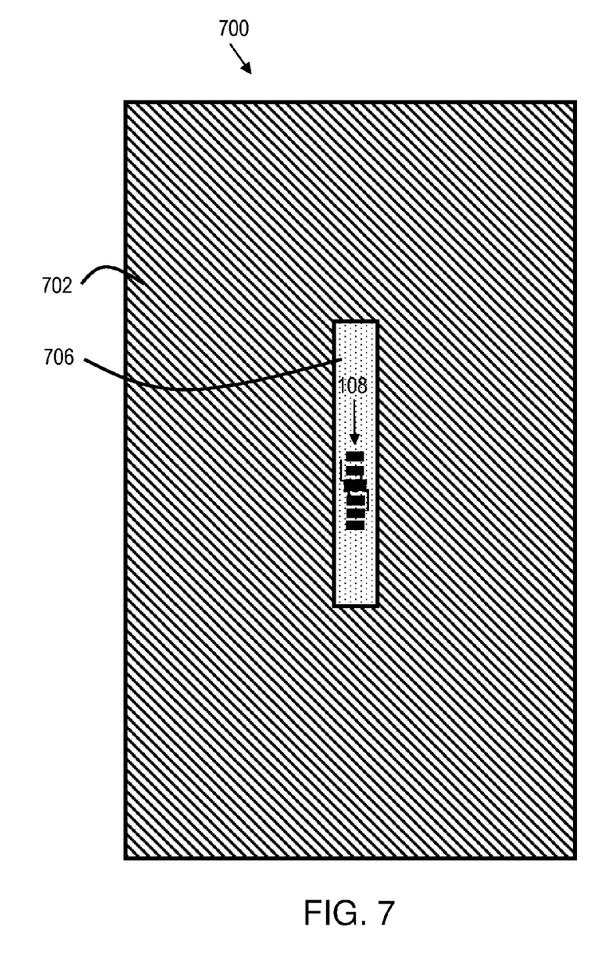
Figure 8:
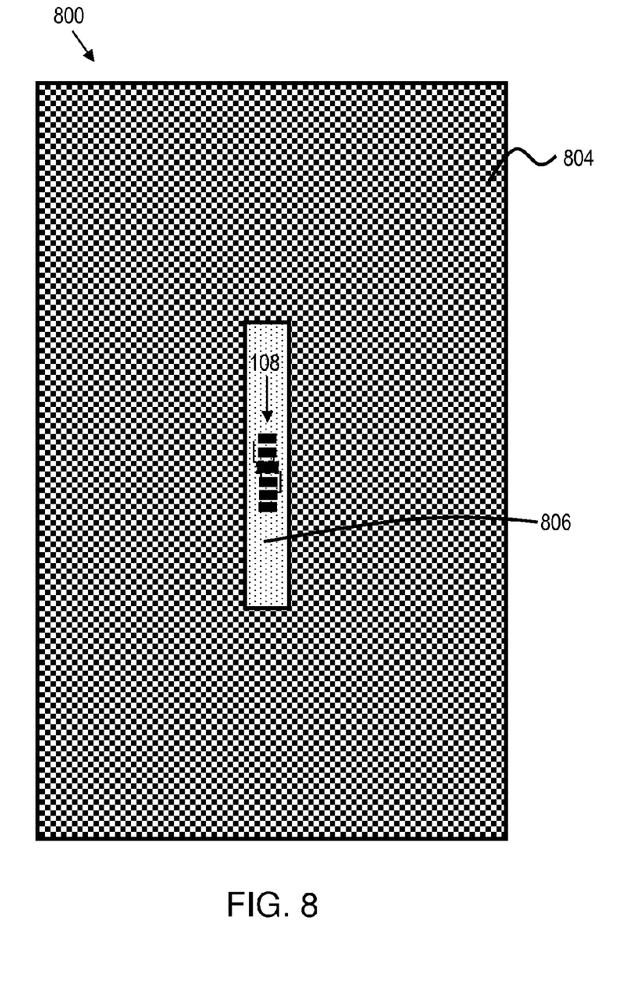

FIGS. 6-8 have no frame structures present. These TAD structures are referred to as "blanket" TAD structures. TAD structure 600 of FIG. 6 has oxide layer 606 completely intact with no frame structures of polysilicon or silicon present. The testing structure 108 is disposed on the oxide layer, substantially in the center of the structure 600. TAD structure 600 is referred to as a "blanket oxide" TAD structure. TAD structure 700 of FIG. 7 has a narrow oxide layer 706 substantially in the center of the structure 700 on which testing structure 108 is disposed. The remainder of the TAD structure is the exposed silicon layer 702 with the polysilicon layer completely removed. TAD structure 700 is referred to as a "blanket silicon" TAD structure. TAD structure 800 of FIG. 8 has a narrow oxide layer 806 substantially in the center of the structure 800 on which testing structure 108 is disposed. The remainder of the oxide layer has been completely removed to expose polysilicon layer 804. TAD structure 800 is referred to as a "blanket polysilicon" TAD structure.

Figure 9:
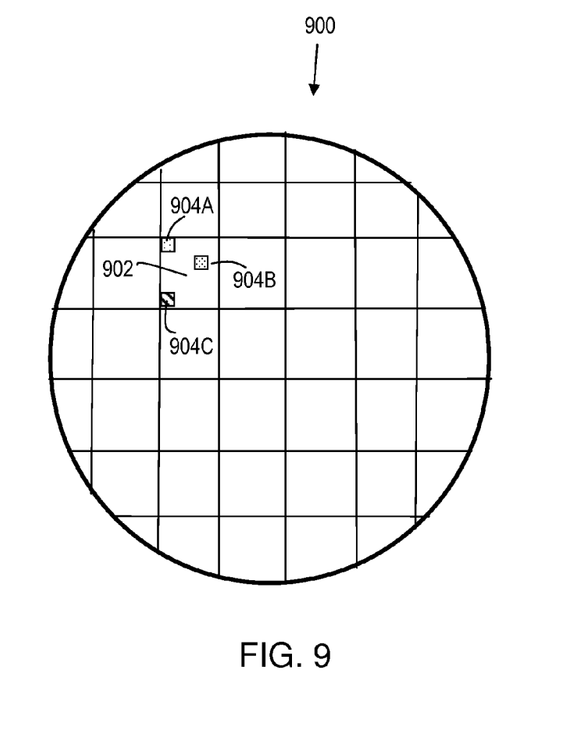
FIG. 9 shows an exemplary placement of thermal absorption detection structures on a semiconductor device within a wafer.

FIG. 9 shows an exemplary placement of thermal absorption detection structures 904A-904C on a semiconductor device 902 within a wafer 900. Wafer 900 comprises multiple semiconductor devices 902. Within semiconductor device 902, multiple TAD structures 904A-904C are placed. Each TAD structure may have a different pattern density. For example, TAD structure 904A may have a low pattern density (such as shown in FIG. 7), TAD structure 904B may have a higher pattern density (such as shown in FIG. 5), and TAD structure 904C may have an even higher pattern density (such as shown in FIG. 2). The higher pattern density is achieved by adding more frame structures (e.g. 204A, 204B, 204C, 204D of FIG. 2 as compared to 104A, 104B of FIG. 1A) to a TAD structure. While only three TAD structures 904A-904C are shown in FIG. 9, it is contemplated that more can be used.

The preferred method of the invention comprises, for example, subjecting wafer 900 to a rapid thermal process. The rapid thermal process causes permanent changes to the materials that comprise wafer 900, depending on the thermal absorption. These changes cause a variation in the resistance of the TAD structures (904A-904C).

Once the process completes, and the wafer 900 has cooled down to room temperature, the sheet resistance of the TAD structures (904A-904C) is then measured using the testing structures (e.g. 108, FIG. 1A) to characterize the relationship of pattern density to thermal absorption. The measured resistance R of the testing structure of a TAD varies inversely as a function of the thermal absorption of the TAD. Thus the measured resistance R correlates to the thermal absorption value (the amount of thermal absorption that took place during the RTP) of the TAD.

Figure 1D:
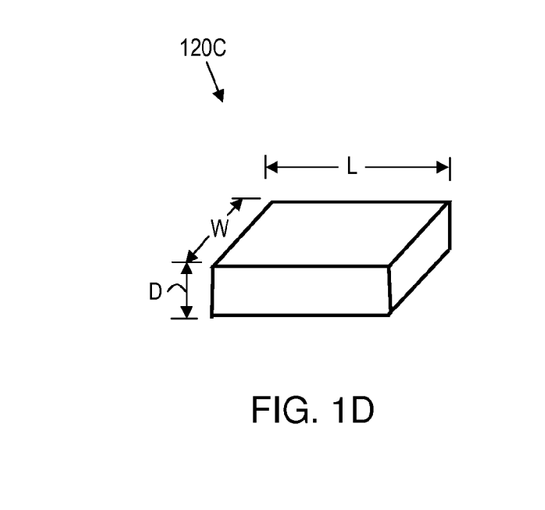
FIG. 1D shows the cross sectional area of a section of the material being measured.

In general, the measured resistance (R) relates to the resistivity ($\rho$) of the material of the test structure 108 via the following formula:

$$R = \rho * L/A,$$

where L is the length and A is the cross sectional area (W×D) of the portion of material being measured via test structure 108 (see FIG. 1D). For a given test structure 108, L, W, and D are known, and the resistance R is measured, thereby allowing the resistivity ($\rho$) to be calculated. In the example shown in FIG. 1D, the portion of material being tested is indicated as 120C in FIG. 1C. When making a test wafer (such as wafer 900 in FIG. 9) it is preferable to include at least one blanket TAD structure (see FIGS. 6-8). The blanket tad structure serves as a baseline reference as to the correlation between the thermal absorption of the die on which it is formed and the measured resistance R of the test structure 108. Other variations of TAD structures (such as those shown in FIG. 1A, and FIGS. 2-8) are also placed on test wafer (such as 902 in FIG. 9) and the relationship between the measured resistance R and the pattern density (the ratio of silicon covered with oxide or poly-crystalline silicon to exposed silicon over a given area) is tabulated for each TAD structure. The measured resistance R can be used to derive the resistivity for each TAD structure via the formula R=$\rho$*L/A, which was defined previously.

In general, subjecting a semiconductor to more thermal absorption will result in a lower value of the measured resistance R, due to better activation of dopants within the semiconductor. The measured resistance value R of various TAD structures can be tabulated and mathematical function and/or plotted curve may be used to establish a relationship between thermal absorption and resistivity. Since the thermal absorption with a TAD structure is based on a known pattern density, a relationship between pattern density and thermal absorption can be estimated. This information is then used to optimize the RTP for the actual semiconductor device that is to be manufactured. For example, since the pattern density of the final device is known, the thermal absorption can now be derived based on the data retrieved from measuring the resistance of the TAD structures (904A-904C) on the test wafer 900. The RTP process can then be optimized to match the desired thermal absorption. Various RTP parameters can be adjusted, such as cycle time, and wavelength of the radiant source, just to name some. Alternatively, working with a predetermined acceptable tolerance range for resistivity, the semiconductor design may be modified so that it has the pattern density required in order to have a particular amount of thermal absorption that keeps the resistivity of the polysilicon (or silicon) within the desired limits.

As mentioned previously in this disclosure, while most of the discussion of this invention refers to an embodiment of a TAD structure having a rectangular shape, other shapes are possible, and within the scope of the present invention. The exemplary embodiments shown in FIGS. 10-12 are in no way intended to be an exhaustive display of the possible TAD structure arrangements, but simply to show some of the other contemplated designs.

Figure 10:
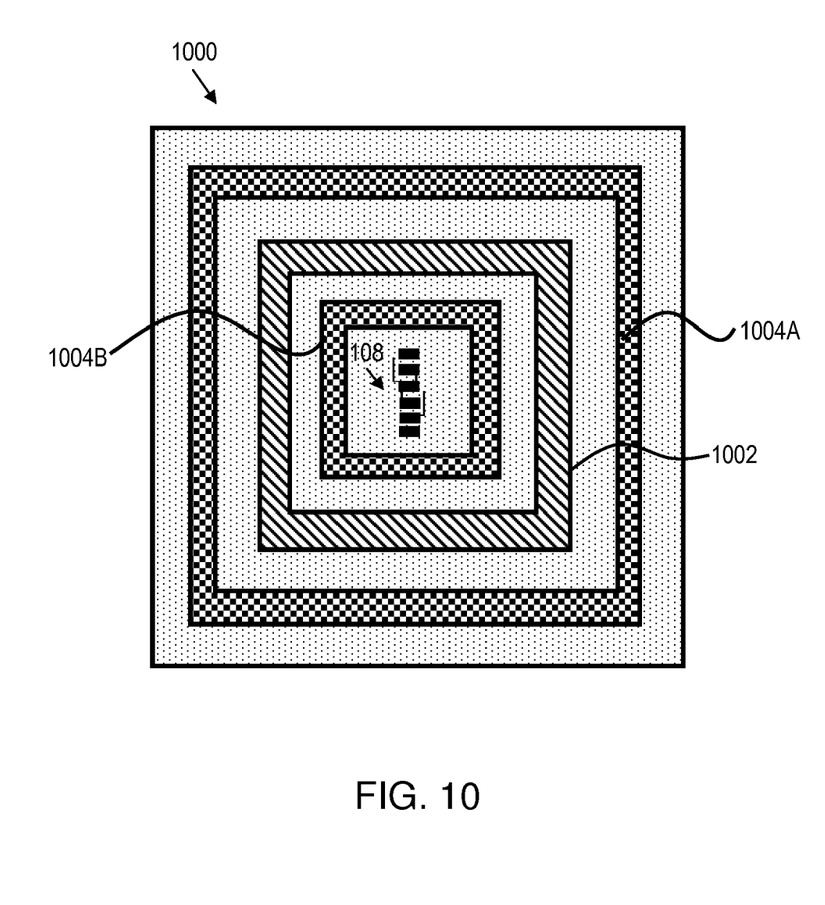
FIGS. 10-12 show alternative embodiments of the thermal sensor of the thermal absorption detection structure of the present invention.

FIG. 10 shows a square shaped TAD structure 1000, having two polysilicon frame structures (1004A and 1004B), and one silicon frame structure 1002. As with the other embodiments, a testing structure 108 is in the approximate center of the TAD structure 1000.

Figure 11:
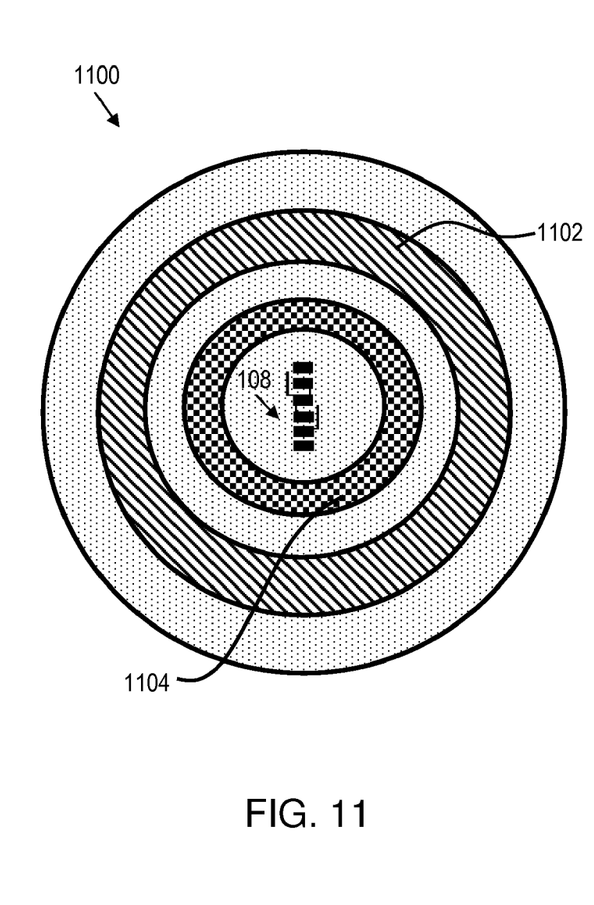
Figure 12:
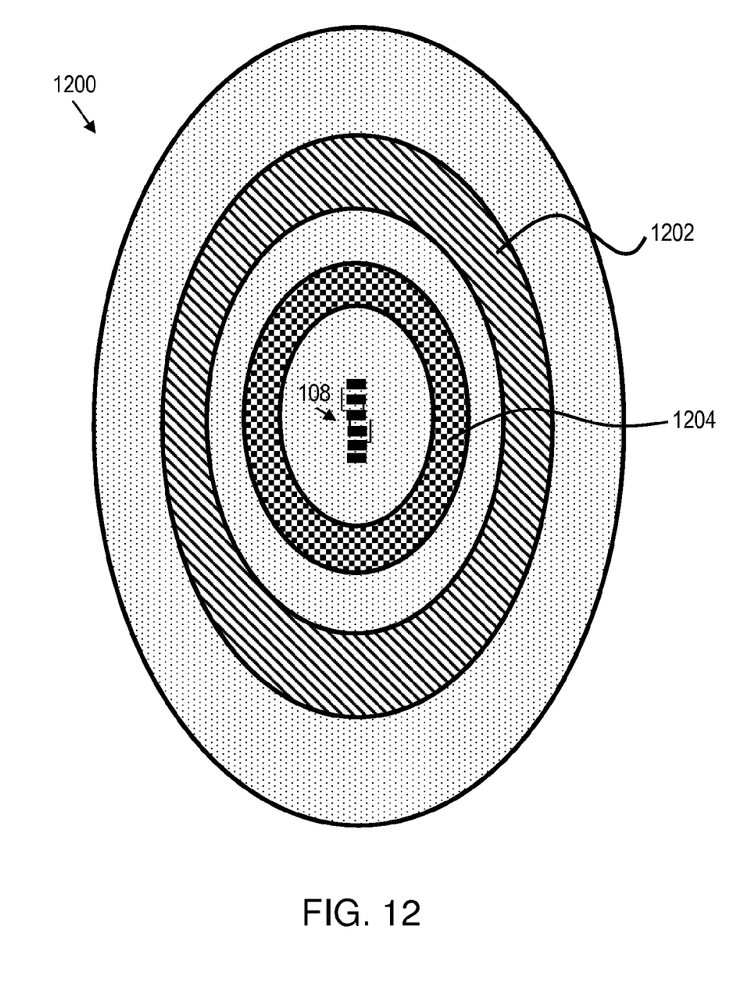

FIG. 11 shows a circular shaped TAD structure 1100, having polysilicon frame structure 1104, and silicon frame structure 1102. As with the other embodiments, a testing structure 108 is in the approximate center of the TAD structure 1100.

FIG. 12 shows an oval shaped TAD structure 1200, having polysilicon frame structure 1204, and silicon frame structure 1202. As with the other embodiments, a testing structure 108 is in the approximate center of the TAD structure 1200.

As can be seen from the preceding description, the present invention provides improved techniques for monitoring and characterizing pattern density dependence on thermal absorption in a semiconductor manufacturing process. It will be understood that the present invention may have various other embodiments. Furthermore, while the form of the invention herein shown and described constitutes a preferred embodiment of the invention, it is not intended to illustrate all possible forms thereof. It will also be understood that the words used are words of description rather than limitation, and that various changes may be made without departing from the spirit and scope of the invention disclosed. Thus, the scope of the invention should be determined by the appended claims and their legal equivalents, rather than solely by the examples given.

What is claimed is:

1. A thermal absorption detection (TAD) structure comprising:
   a substrate comprising a base layer of silicon having at least two closed frame-shaped portions;
   an oxide layer disposed within trenches in the substrate and having at least two closed frame-shaped portions;
   a polysilicon layer disposed on top of the base layer and having at least two closed frame-shaped portions;
   wherein the frame-shaped portions of the base layer, oxide layer and polysilicon layer are arranged to form a pattern of frame-shaped structures having a same shape but different sizes, and collocated with each other;

wherein the base layer is exposed between the frame-shaped portions of the oxide layer and the frame-shaped portions of the polysilicon layer;

wherein the frame-shaped structures are arranged, from an outermost one of the at least two frame-shaped portions of the oxide layer to an innermost one of the at least two frame-shaped portions of the oxide layer, with a selected one of the frame-shaped portions of the base layer or the polysilicon layer disposed within each of the at least two frame-shaped portions of the oxide layer;

further comprising an innermost portion of the oxide layer disposed within an innermost one of the selected frame-shaped portions of the base layer or the polysilicon layer; and a test structure formed on the innermost one of the oxide layers.

2. A TAD structure, according to claim 1, wherein selected ones of the polysilicon layers are disposed on top of layers of gate oxide which are disposed on top of the base layer.

3. A TAD structure, according to claim 1, wherein the test structure is a Kelvin test structure.

4. A TAD structure, according to claim 3, wherein the test structure comprises polysilicon.

5. A TAD structure, according to claim 3, wherein the test structure comprises mono-crystalline silicon.

6. A TAD structure, according to claim 1, wherein the base layer comprises single crystalline silicon.

7. A TAD structure, according to claim 1, wherein the frame-shaped structures have a shape selected from the group consisting of rectangular, square, circular and oval.

8. A TAD structure, according to claim 1, wherein the frame-shaped structures are arranged, with a pattern comprising at least one iteration of oxide, poly, oxide, base layer.

9. A TAD structure, according to claim 1, wherein the frame-shaped structures are arranged, with a pattern comprising at least one iteration of oxide, poly.

10. A TAD structure, according to claim 1, wherein the frame-shaped structures are arranged, with a pattern comprising at least one iteration of oxide, base layer.

11. A semiconductor wafer comprising a plurality of (lies, at least one die having one or more thermal absorption detection structures thereon for characterizing and monitoring a dependence of pattern density of the at least one die on thermal absorption of the at least one die, and at least one of the thermal absorption detection structures comprising:

a substrate comprising a base layer of silicon having at least two closed frame-shaped portions;

an oxide layer disposed within trenches in the substrate and having at least two closed frame-shaped portions;

a polysilicon layer disposed on top of the base layer and having at least two closed frame-shaped portions;

wherein the frame-shaped portions of the base layer, oxide layer and polysilicon layer are arranged to form a pattern of frame-shaped structures having a same shape but different sizes, and collocated with each other;

wherein the base layer is exposed between the frame-shaped portions of the oxide layer and the frame-shaped portions of the polysilicon layer;

wherein the frame-shaped structures are arranged, from an outermost one of the at least two frame-shaped portions of the oxide layer to an innermost one of the at least two frame-shaped portions of the oxide layer, with a selected one of the frame-shaped portions of the base layer or the polysilicon layer disposed within each of the at least two frame-shaped portions of the oxide layer;

further comprising an innermost portion of the oxide layer disposed within an innermost one of the selected frame-shaped portions of the base layer or the polysilicon layer; and a test structure formed on the innermost one of the oxide layers.

12. A semiconductor wafer, according to claim 11, wherein the test structure is a Kelvin test structure.

* * * * *